(12) United States Patent  
Sharma et al.

(10) Patent No.: US 11,101,377 B2  
(45) Date of Patent: Aug. 24, 2021

(54) TRANSISTOR DEVICE WITH HETEROGENEOUS CHANNEL STRUCTURE BODIES AND METHOD OF PROVIDING SAME

(71) Applicant: Intel Corporation, Santa Clara, CA (US)

(72) Inventors: Abhishek A. Sharma, Hillsboro, OR (US); Gilbert Dewey, Hillsboro, OR (US); Van H. Le, Beaverton, OR (US); Willy Rachmady, Beaverton, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 15/939,087

(22) Filed: Mar. 28, 2018

(65) Prior Publication Data

US 2019/0305121 A1    Oct. 3, 2019

(51) Int. Cl.
*H01L 29/778* (2006.01)
*H01L 29/66* (2006.01)
*H01L 29/267* (2006.01)

(52) U.S. Cl.
CPC ........ *H01L 29/7781* (2013.01); *H01L 29/267* (2013.01); *H01L 29/66462* (2013.01)

(58) Field of Classification Search
CPC .................. H01L 29/267; H01L 29/78696
See application file for complete search history.

(56) References Cited

U.S. PATENT DOCUMENTS

2006/0186484 A1*   8/2006   Chau .................. H01L 29/785
257/401

* cited by examiner

*Primary Examiner* — Daniel P Shook
(74) *Attorney, Agent, or Firm* — Green, Howard & Mughal LLP

(57) ABSTRACT

Techniques and mechanisms for providing efficient transistor functionality of an integrated circuit. In an embodiment, a transistor device comprises a first body of a high mobility semiconductor and a second body of a wide bandgap semiconductor. The first body adjoins each of, and is disposed between, the second body and a gate dielectric layer of the transistor. The second body extends between, and variously adjoins, each of a source of the transistor and a drain of the transistor. A location of the second body mitigates current leakage that might otherwise occur via the first body. In another embodiment, a mobility of the first body is equal to or greater than 100 cm²/V·s, wherein a bandgap of the second body is equal to or greater than 2.0 eV.

25 Claims, 8 Drawing Sheets

TRANSISTOR DEVICE WITH HETEROGENEOUS CHANNEL STRUCTURE BODIES AND METHOD OF PROVIDING SAME

BACKGROUND

1. Technical Field

Embodiments of the present invention generally relate to microelectronic devices and their methods of fabrication, and more particularly, but not exclusively, to layered semiconductor structures of a transistor.

2. Background Art

Higher performance, lower cost, increased miniaturization of integrated circuit components, and greater packaging density of integrated circuits are ongoing goals in the microelectronic industry for the fabrication of microelectronic devices. As these goals are achieved, the microelectronic devices scale down (i.e., become smaller), which increases the need for optimal performance from each integrated circuit component, including managing transistor drive currents while reducing short-channel effects, parasitic capacitance, and off-state leakage.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
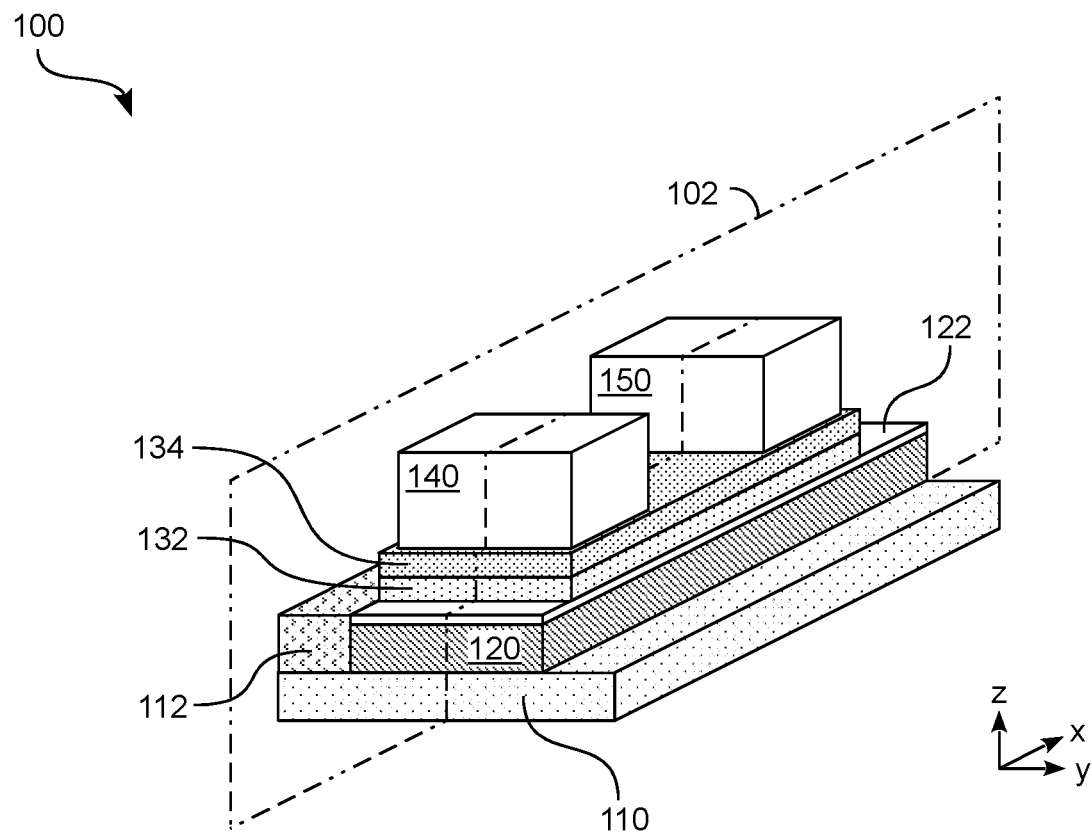
FIG. 1 shows a perspective view and a cross-sectional side view each of a semiconductor device according to an embodiment.
Figure 1:
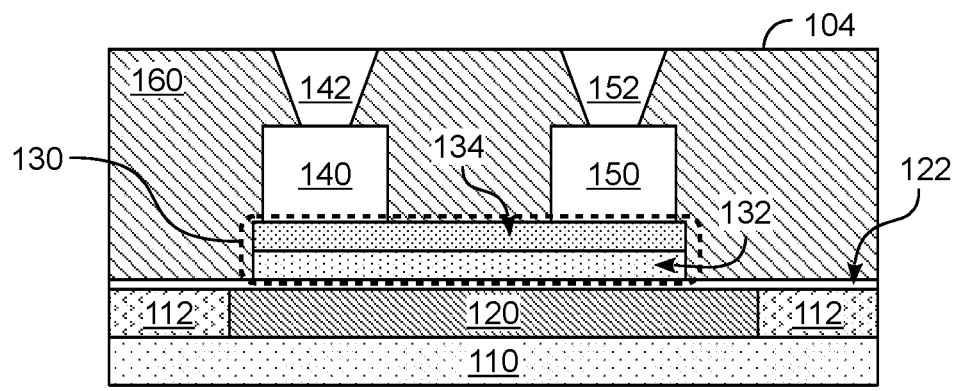

Embodiments discussed herein variously provide techniques and mechanisms for an integrated circuit transistor device to exhibit improved operational characteristics. In an embodiment, a transistor comprises source or drain structures and a channel structure which spans a region which extends between said source or drain structures. A first semiconductor body and a second semiconductor body of the channel structure may comprise different respective semiconductor materials. The first semiconductor body may include a high mobility material which adjoins a gate dielectric layer. In such an embodiment, the second semiconductor body may include a wide bandgap material, portions of which each adjoin a different respective one of the source or drain structures. For example, the first semiconductor body may be between the second semiconductor body and the gate dielectric—e.g., wherein a portion of the second semiconductor body is between the first semiconductor body and one of the source or drain structures. By providing a wide bandgap semiconductor body at a side of the high mobility semiconductor body, some embodiments enable improved gain, switching and/or other performance benefits which are associated with conventional high mobility transistor designs, while also mitigating current leakage which is typically result from such designs.

As used herein, "source or drain structure" (or "SD structure") refers to a structure which is configured to function as one of a source of a device or a drain of the device. A SD structure may comprise at least a conductive surface which provides a contact electrode that adjoins a semiconductor material. "Channel structure" refers herein to a structure of a device which, during operation of the device, may be used to selectively provide a conductive channel between two SD structures of the device. A contiguous body of one or more semiconductor materials (or "semiconductor structure" herein) may include or function as a channel structure.

As used herein, "back-gate transistor" refers to a transistor which comprises a gate structure that, as compared to a SD structure of that same transistor, is relatively close to an underlying substrate. Such a gate structure may be disposed between the substrate and one or both of a source structure and a drain structure of the transistor. As used herein, "high mobility" refers to the property of a material having a mobility which is equal to or greater than 100 $cm^2/V \cdot s$. "Wide bandgap" refers to the property of a material having a bandgap which is equal to or greater than 2.0 eV.

Certain features of various embodiments are described herein with reference to a back-gate transistor, a channel structure of which comprises portions that each provide a different respective one of a high mobility and a wide bandgap. However, such description may be extended to additionally or alternatively apply to any of a variety of other types of transistors which include a first semiconductor body and second semiconductor body with different respective physical properties.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including one or more transistors of an integrated circuit.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The term "adjacent" here generally refers to a position of a thing being next to (e.g., immediately next to or close to with one or more things between them) or adjoining another thing (e.g., abutting it).

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy.

These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

FIG. 1 shows a portion of an IC device 100 which includes transistor structures according to an embodiment. FIG. 1 also shows a cross-sectional side view 104 of IC device 100, wherein view 104 corresponds to a x-z plane 102 of the xyz coordinate system shown. IC device 100 is one example of an embodiment wherein a semiconductor structure (also referred to herein as a "channel structure")

provides a channel region of a transistor, wherein portions of the semiconductor structure have different mobility and/or bandgap characteristics.

As shown, IC device 100 includes a substrate 110, a dielectric 112 on substrate 110, and a gate structure 120 disposed in a recess which is formed at least in part by dielectric 112. Although structures of IC device 100 are variously shown as having respective rectilinear geometries, some or all such structures may instead have curved, obliquely angled, tapered and/or otherwise non-rectilinear shapes. Substrate 110 may be formed of any of a variety of materials that are suitable for use as a substrate of a semiconductor device, and in particular as a substrate for a back-gate (or other) transistor. Non-limiting examples of suitable materials that may be used as substrate 110 therefore include silicon (Si), germanium (Ge), silicon-germanium (SiGe), silicon-carbide (SiC), sapphire, a III-V semiconductor, a silicon on insulate (SOI) substrate, combinations thereof, and the like. Without limitation, in some embodiments substrate 110 is formed from or includes glass or single crystal silicon.

In some embodiments, one or more underlayers (not illustrated) may be deposited on substrate 110, e.g., such that they are present between substrate 110 and one or more of dielectric 112 and the materials forming gate structure 120. For example, one or more semiconductor base layers may be deposited on substrate 110. When used, such base layers may be pseudomorphic, metamorphic, or substantially lattice matched buffer and/or transition layers, as understood in the art. In any case, substrate 110 may be understood to provide an epitaxial seeding surface (e.g., a crystalline surface having a (100) or other suitable orientation) for the subsequent deposition of the materials thereon.

Dielectric 112 may be formed from any material that is suitable for use as an electrical insulator of a semiconductor device. Non-limiting examples of such materials include oxides, nitrides and alloys, such as but not limited to silicon oxide ($SiO_2$), silicon nitride (SiN), combinations thereof, and the like. Without limitation, in some embodiments dielectric 112 is $SiO_2$.

Gate structure 120 may be formed of any of a variety of suitable gate electrode materials. For example, gate structure 120 may comprise any of a variety of suitable conductors including, but not limited to, one of titanium nitride, tungsten, platinum, iridium, gold, ruthenium, a p-type doped polysilicon, zinc, or gallium. It is to be appreciated that gate structure 120 need not include a single material and may (for example) be a composite stack of thin films—e.g., wherein the stack forms a polycrystalline silicon/metal electrode or a metal/polycrystalline silicon electrode.

A transistor of IC device 100—e.g., a thin film transistor, or "TFT"—may comprise structures which are variously disposed over substrate 110 (e.g., including structures over dielectric 112 and/or over gate structure 120). For example, as shown in view 104, such a transistor may include—in addition to gate structure 120—a channel structure 130 and two source or drain ("SD") structures 140, 150 each adjoining a respective portion of channel structure 130. The transistor may further comprise a layer 122 which includes a dielectric material to provide at least some electrical insulation between gate structure 120 and a bottom side of channel structure 130. To protect the transistor, an insulator material 160 (e.g., including silicon dioxide or any of a variety of other dielectric materials) may be variously disposed on or around some or all of SD structures 140, 150, channel structures 130, dielectric 112 or the like. Connectivity to the transistor may be facilitated with one or more electrodes (e.g., including the illustrative electrodes 142, 152 shown) which extend at least in part through insulator material 160. In one example embodiment, electrodes 142, 152 each include copper disposed on a respective layer of tantalum nitride, titanium nitride, pure tantalum, pure titanium, or other such suitable material.

Gate dielectric layer 122 may comprise a high-K dielectric material which, for example, includes one or more of: HfO, AlO, $SiO_2$, SiN, AN, silicon oxynitride, aluminum oxynitride, titanium oxide, titanium aluminum oxide, titanium hafnium oxide, zirconium oxide, titanium zirconium oxide, or aluminum zirconium oxide. In some embodiments, the dielectric material includes one or more of: Hf, Si, O, Zr, Al, or N—e.g., where gate dielectric layer 122 includes silicon dioxide.

SD structures 140, 150 may include any of a variety of conductors which, for example, are adapted from conventional transistor designs. By way of illustration and not limitation, a conductor of SD structures 140, 150 may include one of tungsten, tantalum nitride, titanium nitride, tantalum silicide, platinum, iridium, ruthenium, or cobalt. A conductive surface of SD structure 140 may be provided at an interface with channel structure 130—e.g., wherein a conductive surface of SD structure 150 is provided at an interface with channel structure 130. For example, channel 130 may comprise a body 134 of a semiconductor (or "semiconductor body" herein) which adjoins a silicide, germanide, arsenide, metal or otherwise conductive surface of SD structure 140—e.g., wherein semiconductor body 134 also adjoins a conductive surface of SD structure 150. Although some embodiments are not limited in this regard, SD structures 140, 150 may each further comprise a respective semiconductor material—e.g., wherein one or each of SD structures 140, 150 comprises layers having different conductivity properties.

SD structures 140, 150 and channel structure 130 are configured to conduct current during operation of IC device 100—e.g., the current controlled using gate structure 120. For example, SD structures 140, 150 may be separated from one another (e.g., along the x-axis shown) by a distance which, in some embodiments, is in a range of 5 nanometers (nm) to 80 nm. Semiconductor body 134 may extend under and/or along this separation distance to variously adjoin respective portions of SD structures 140, 150. In such an embodiment, another semiconductor body 132 of channel structure 130 may be disposed between semiconductor body 134 and each of layer 122 and gate structure 120. Operation of IC device 100 may include an application of voltages at respective ones of SD structures 140, 150 and gate structure 120 to create a conductive channel in channel structure 130.

To mitigate current leakage or otherwise promote efficient transistor performance, some embodiments provide a channel structure which includes both a body of a high mobility semiconductor material and another body of a wide bandgap semiconductor material. For example, as illustrated in view 104, the body 134 of a wide bandgap semiconductor may extend between (and variously adjoins) SD structures 140, 150. In such an embodiment, at least some of the body 132 of a high mobility semiconductor may be disposed between body 134 and layer 122. Although some embodiments are not limited in this regard, a portion of body 134 may be disposed between body 132 and one of SD structures 140, 150. For example, each of SD structures 140, 150 may be separated from body 132 by a respective portion of body 134.

Body 132 may be formed of any of a variety of suitable semiconductor materials including, but not limited to, one of epitaxial (e.g., monocrystalline or polycrystalline) silicon, epi germanium, or epi silicon germanium (SiGe), InP, GaAs, GaN, InGaAs, InGaN, GaAlN, InAlN, or InAs. In some embodiments, body 132 comprises a Group III-V semiconductor. Alternatively, body 132 may comprise an oxide of indium—e.g., InGaO, InO or the like—which has an oxygen vacancy level (e.g., less than $10^{17}$ per cm$^3$) that contributes to a mobility which is equal to or greater than 100 square centimeters per Volt second (cm$^2$/V·s).

Body 134 may be formed of any of a variety of suitable semiconductor materials including, but not limited to, one of InGaZO, zinc oxide, InO, GaO, TiO$_2$, AZO, ITO, IZO, polysilicon, Ge, alloys thereof, etc. In some embodiment, an oxygen vacancy level—e.g., more than $10^{17}$ per cm$^3$—a level of doping (if any) and/or other such characteristics of body 134 may contribute to a bandgap which is equal to or greater than 2.0 electron Volts (eV).

A thickness (z-axis dimension) of channel structure 130 may, for example, be in a range of 2 nm to 40 nm—e.g., wherein one or both of a length (x-axis dimension) and a width (y-axis dimension) of channel structure 130 is/are in a range of 10 nm to 100 nm. In such an embodiment, respective thicknesses of SD structures 140, 150 may be in a range of 2 nm to 50 nm—e.g., wherein respective lengths and/or respective widths of SD structures 140, 150 are each in a range of 10 nm to 100 nm. In some embodiments, portion 132 may be self-aligned with SD structure 140 and/or portion 134 may be self-aligned to SD structure 150. Such self-alignment may be width respect to a length dimension, a width dimension or a combination thereof.

In one embodiment, a thickness of layer 122 is in a range of 1 nm to 30 nm. It is to be appreciated that a length of gate structure 120 may be greater than, equal to or even smaller than a length of channel structure 130. Similarly, a width of gate structure 120 may be greater than, equal to or even smaller than a width of channel structure 130. The respective lengths of gate structure 120 and layer 122 may vary significantly in different embodiments based on implementation-specific details (e.g., including the presence, proximity and configuration of any other circuit elements on substrate 110). It is to be appreciated that the above dimensions are merely illustrative, and may vary in different embodiments according to implementation-specific details.

Figure 2:
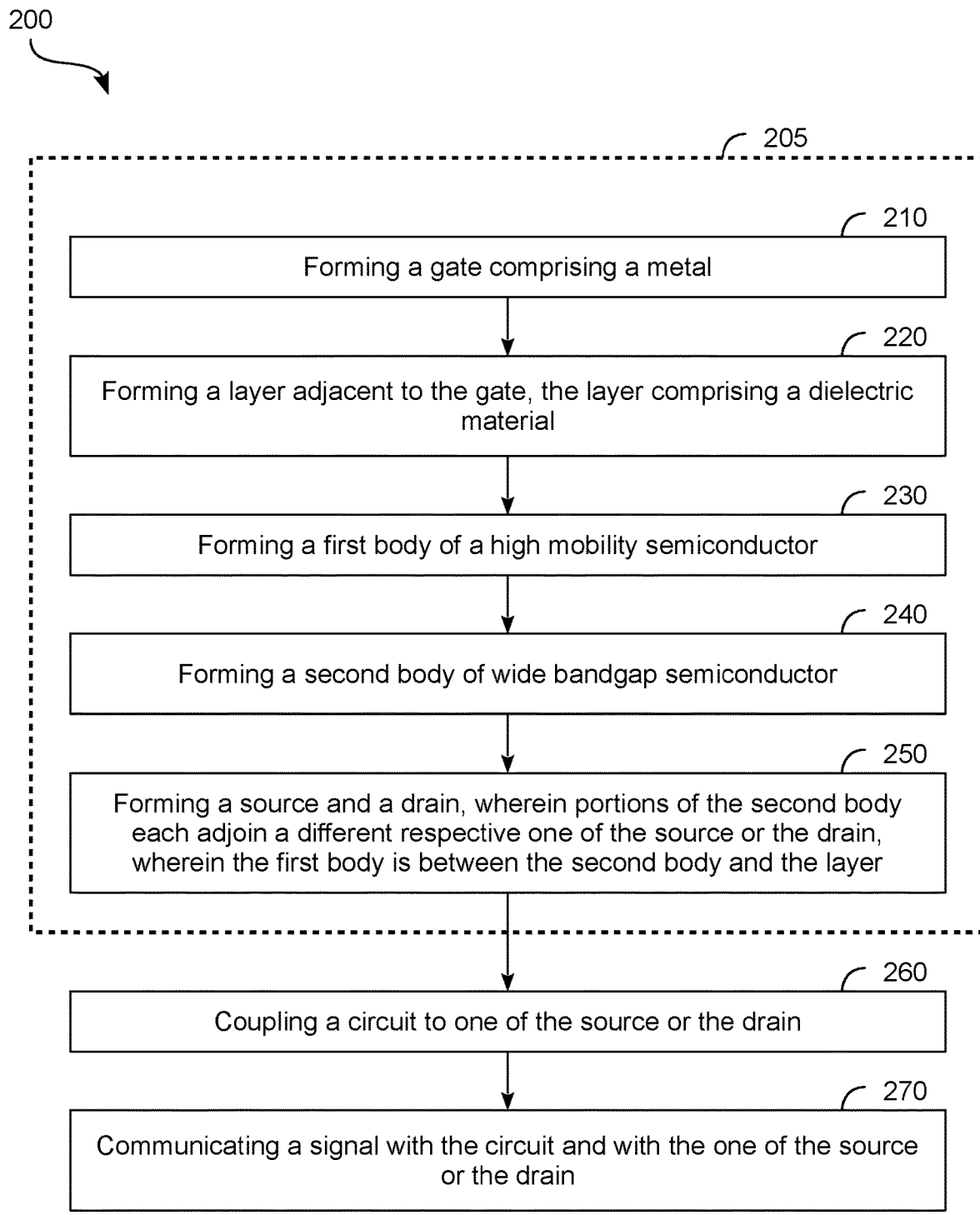
FIG. 2 illustrates a flow diagram illustrating elements of a method for fabricating structures of a transistor according to an embodiment.

FIG. 2 shows features of a method 200 to provide functionality of an integrated circuit device according to an embodiment. Method 200 may fabricate some or all structures of IC device 100, for example. To illustrate certain features of various embodiments, method 200 is described herein with reference to structures which are variously shown in FIGS. 3A, 3B. However, method 200 may additionally or alternatively fabricate any of a variety of other structures, in different embodiments.

As shown in FIG. 2, method 200 may comprise operations 205 to fabricate a transistor, a channel structure of which comprises both a high mobility semiconductor body and a wide bandgap semiconductor body. In an embodiment, operations 205 comprise (at 210) forming a gate comprising a metal, and (at 220) forming a layer adjacent to the gate, the layer comprising a dielectric material. The various forming at 210 and 220 may include masking, lithography, etching, deposition (e.g., chemical vapor deposition, atomic layer deposition or the like) and/or other operations which, for example, are adapted from conventional semiconductor fabrication techniques.

Figure 3A:
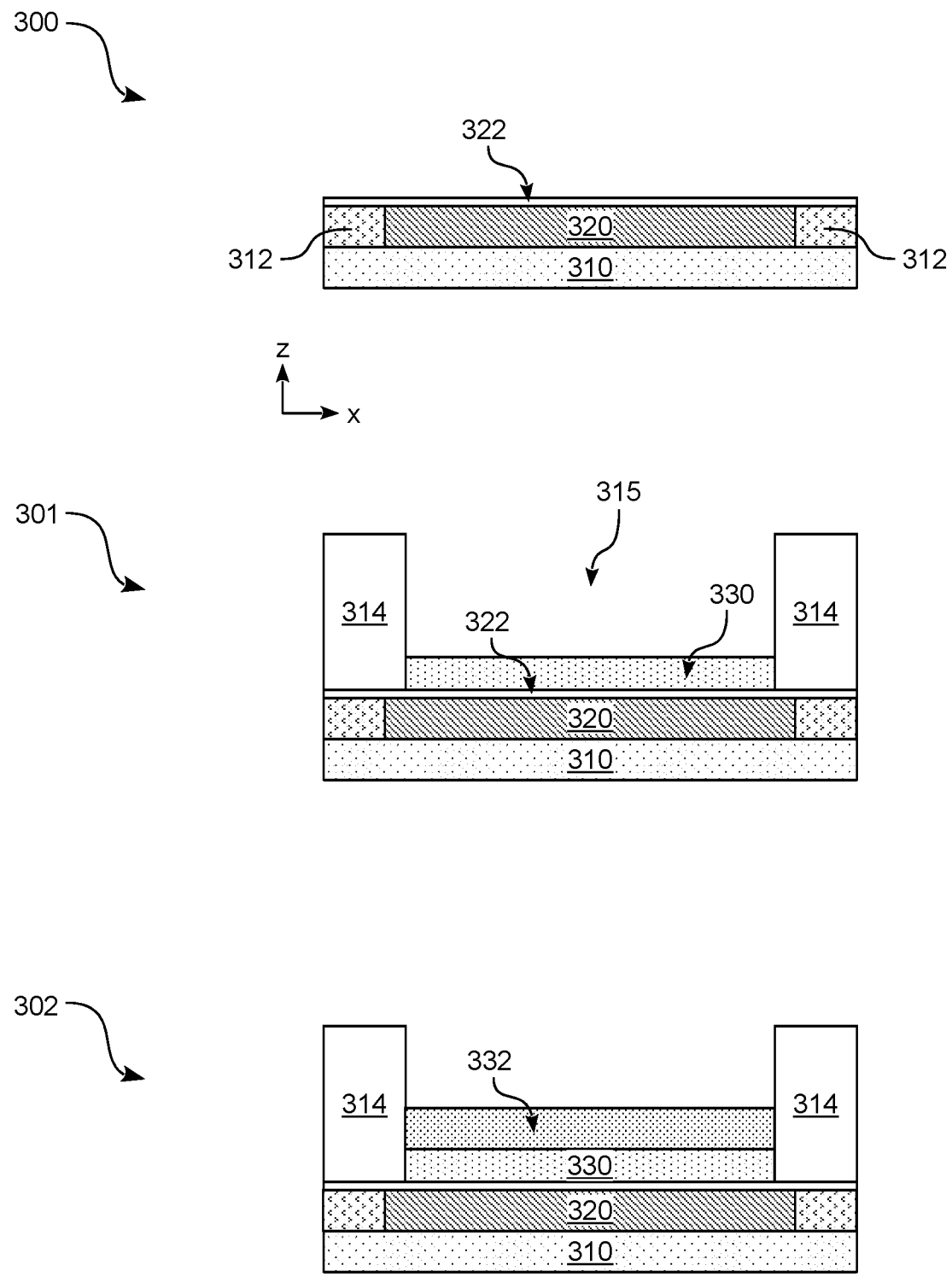
FIGS. 3A, 3B show cross-sectional views each of a respective stage of processing to fabricate structures of a semiconductor device according to an embodiment.
Figure 3B:
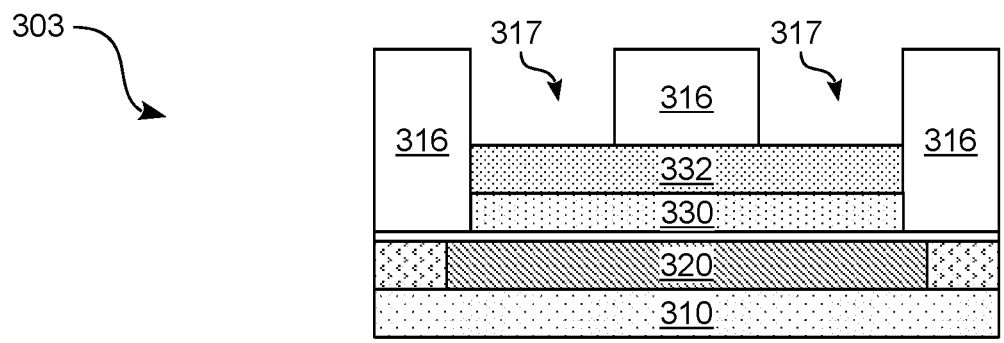
Figure 3B:
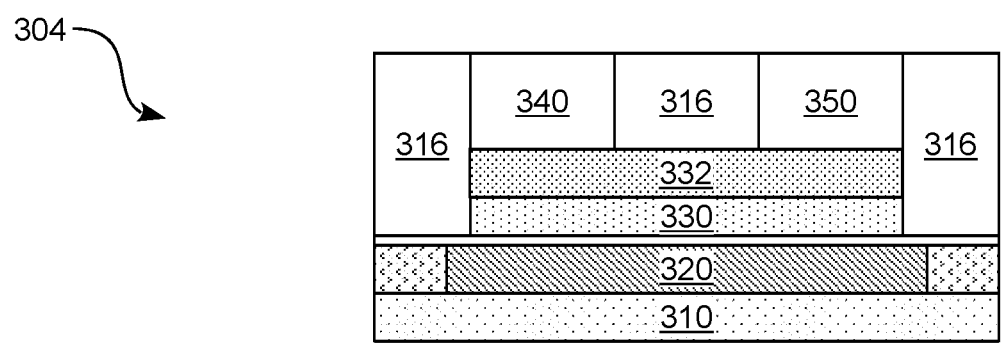
Figure 3B:
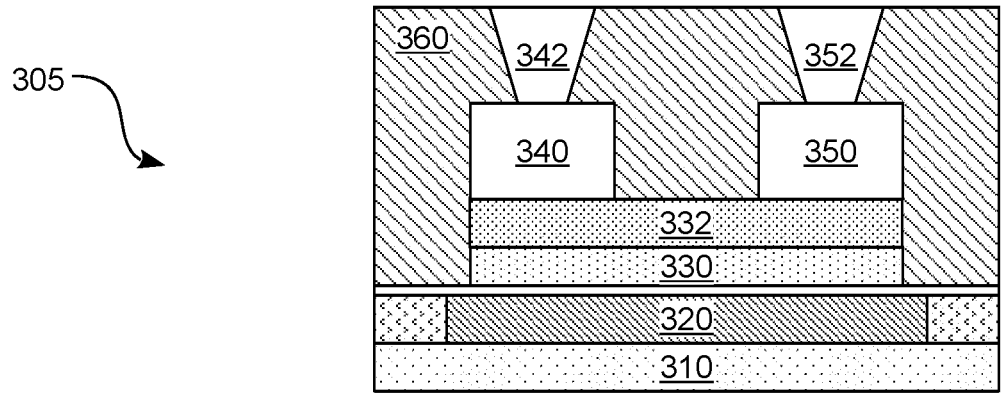

Referring now to FIGS. 3A, 3B, various respective cross-sectional views are shown for stages 300 through 305 of processing to fabricate transistor structures according to an embodiment. More particularly, for each of stages 300 through 305, corresponding structures during that stage are shown in a respective x-z plane cross-sectional view. The processing represented by stages 300 through 305 may include operations of method 200—e.g., wherein such processing is to fabricate a device having at least some features of IC device 100.

As shown at stage 300, a gate structure 320 may be disposed on a substrate 310, the gate structure 320 located in a recess which is formed at least in part by a dielectric 312. Substrate 310, dielectric 312 and gate structure 320 may correspond functionally to substrate 110, dielectric 112 and gate structure 120 (respectively), in one embodiment. Gate structure 320 may be located in a recess which is formed at least in part by a dielectric 312. The forming at 210 may include a selective deposition of one or more metal materials into such a recess to form gate structure 320. Such selective deposition may include one or more operations which, for example, are adapted from conventional techniques to fabricate structures of a back-end (or other) transistor device. In such an embodiment, the forming of the layer at 220 may include—at stage 300—depositing at least on a surface of gate structure 320 a layer 322 of a dielectric material (such as that of layer 122). For example, layer 322 may be formed by depositing one or more layers of dielectric material via chemical vapor deposition (CVD), plasma enhanced CVD, or another suitable deposition process. The extent of layer 322 may be limited or otherwise defined by use of a patterned mask (not shown) during such deposition.

Referring again to FIG. 2, method 200 may further comprise (at 230) forming a first body of a first "high mobility" semiconductor adjacent to the layer—e.g., wherein a mobility of the first semiconductor is equal to or greater than 100 cm$^2$/V·s. The first semiconductor may comprise any of a variety of high mobility materials that, for example, are adapted from conventional transistor designs. In an embodiment, the first semiconductor comprises one of gallium, nitrogen, silicon, indium, phosphorous, or arsenic (for example, one of GaN, Si, InP, or GaAs)—e.g., wherein the first semiconductor comprises gallium and one of nitrogen, or arsenic. The first body formed at 230 may correspond functionally to semiconductor body 132.

For example, referring again to FIGS. 3A, 3B, a patterned mask 314 may be formed directly or indirectly over one or both of dielectric 312 and some of layer 322 (as shown at stage 301). A hole 315 formed by mask 314 may expose at least a portion of layer 322, the hole 315 enabling a first deposition of a high mobility semiconductor to form a semiconductor body 330.

Referring again to FIG. 2, method 200 may further comprise (at 240) forming a second body of a second semiconductor other than the first semiconductor, wherein a bandgap of the second semiconductor is equal to or greater than 2.0 eV. For example, as shown at stage 302, a wide bandgap semiconductor may be deposited through hole 315 and onto an exposed surface of the previously formed semiconductor body 330. Such deposition may result in the formation of another semiconductor bodies 332. The second (wide bandgap) semiconductor may comprise one of titanium, indium, gallium, zinc, arsenic, tin, silicon, or germanium—e.g., wherein the second semiconductor comprises oxygen and one of titanium, indium, gallium, zinc, arsenic, or tin. Although some embodiments are not limited in this regard, the high mobility semiconductor and the wide bandgap semiconductor may have partially (i.e., only partially) similar chemical compositions—e.g., wherein such compositions vary from one another at least with respect to dopant levels, oxygen vacancy levels and/or the like.

In an embodiment, method 200 further comprises (at 250) forming a source and a drain, wherein portions of the second body each adjoin a different respective one of the source or the drain, wherein the first body is between the second body and the layer which is formed at 220. In some embodiments, a first portion of the second body is disposed between the first body and one of the source or the drain—e.g., wherein a second portion of the second body is disposed between the first body and another of the source or the drain. A portion of the second body is between the gate and an underlying substrate, wherein a thickness of the second body is in a range of 0.2 nanometers (nm) to 5.0 nm. Alternatively, the gate may be between the second body and a substrate, wherein a thickness of the second body is more than 5.0 nanometers (e.g., where the thickness of the second body is in a range of 6 nm to 20 nm).

Referring now to stage 303, another patterned mask 316 may be formed directly or indirectly over at least some of semiconductor bodies 330, 332—e.g., wherein portions of patterned mask 316 further extend over one or both of dielectric 312 and some of layer 322. Holes 317 formed by patterned mask 316 may leave portions of semiconductor body 332 exposed to a subsequent deposition processing. For example, as shown at stage 304, the forming at 250 may comprise a conductive material being variously deposited into holes 317 to form SD structures 340, 350 over respective portions of semiconductor body 332.

Referring again to FIG. 2, method 200 may (in some embodiments) additionally or alternatively comprise one or more operations which provide connectivity with and/or operation of a transistor device such as one resulting from operations 205. For example, method 200 may comprise (at 260) coupling a circuit to one of the source or the drain, and/or (at 270) communicating a signal with such a circuit and with the one of the source or the drain.

For example, stages 300-304 may result in the formation of a transistor comprising gate structure 320, layer 322, SD structures 340, 350 and a semiconductor structure (comprising bodies 330, 332) which is to function as a channel structure for conducting a current between SD structures 340, 350. As shown at stage 305, an insulator material 360 may be deposited over SD structures 340, 350, over the semiconductor structure and/or other such circuit structures. Connectivity with such a transistor may be provided at least in part with electrodes 342, 352 which extend into insulator material 360 to couple to SD structures 340, 350 (respectively).

Figure 4:
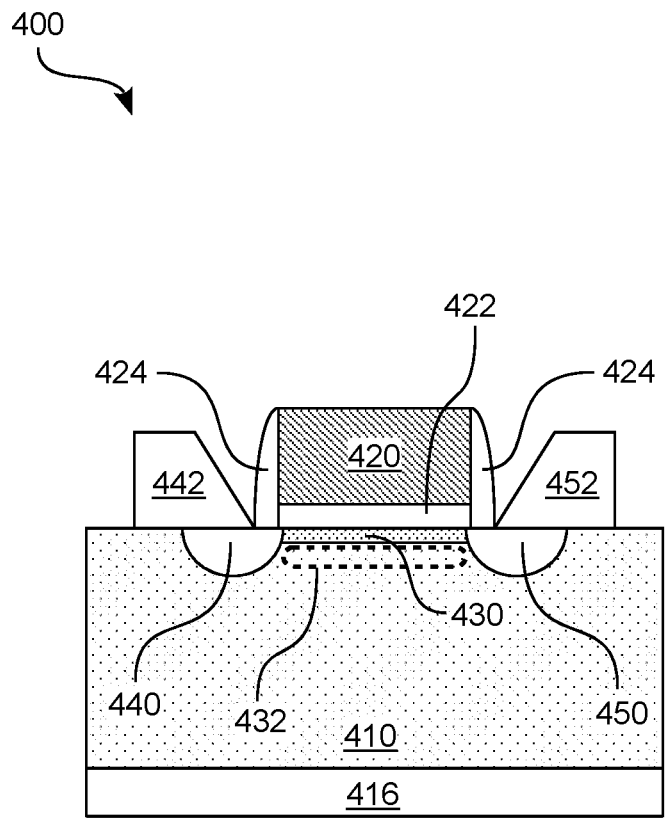
FIG. 4 shows a cross-sectional side view of a transistor device according to an embodiment.

FIG. 4 shows features of an integrated circuit (IC) 400 comprising a transistor which includes an arrangement of semiconductor structures according to another embodiment. IC 400 is one example of an embodiment wherein a transistor comprises a first body of a high mobility semiconductor material and a second body of a wide bandgap semiconductor material, wherein the first body is disposed between a dielectric layer and the second body, and wherein both the first body and the second body extend between (and variously adjoin) two doped source or drain regions of the transistor. IC 400 may include features of IC device 100, for example. In some embodiments, functionality of IC 400 is provided according to operations of method 200.

As shown in FIG. 4, IC 400 may include one or more material layers 410 which are disposed, directly or indirectly, on an underlying substrate 416. The one or more material layers 410 may include at least a body 432 of a wide bandgap semiconductor material. In some embodiments, one or more material layers 410 further comprise one or more other semiconductor layers and/or one or more insulation layers (e.g., including a buried oxide layer). Such one or more additional layers may variously provide a lattice gradient, a potential well and/or the like.

In such an embodiment, a transistor of IC 400 may comprise—in addition to body 432—a gate 420, a layer 422 of a dielectric material, a layer 430 of a high mobility semiconductor material, a SD structures each comprising a respective one of doped SD regions 440, 450, and a respective one of SD contacts 442, 452. Sidewall spacers 424 may facilitate electrical insulation between gate 420 and other structures (such as SD contacts 442, 452). Layer 422 may be disposed directly or indirectly on a side of the one or more material layers 410—e.g., wherein layer 422 is between gate 420 and layer 430, wherein layer 430 is between layer 422 and body 432. Layer 430 and body 432 may each extend between the SD structures—e.g., wherein layer 430 and body 432 each variously adjoin doped SD regions 440, 450. Semiconductor bodies 430, 432, layer 422 and gate 420 may functionally correspond (respectively) to semiconductor bodies 134, 132, layer 122 and gate 120.

Figure 5:
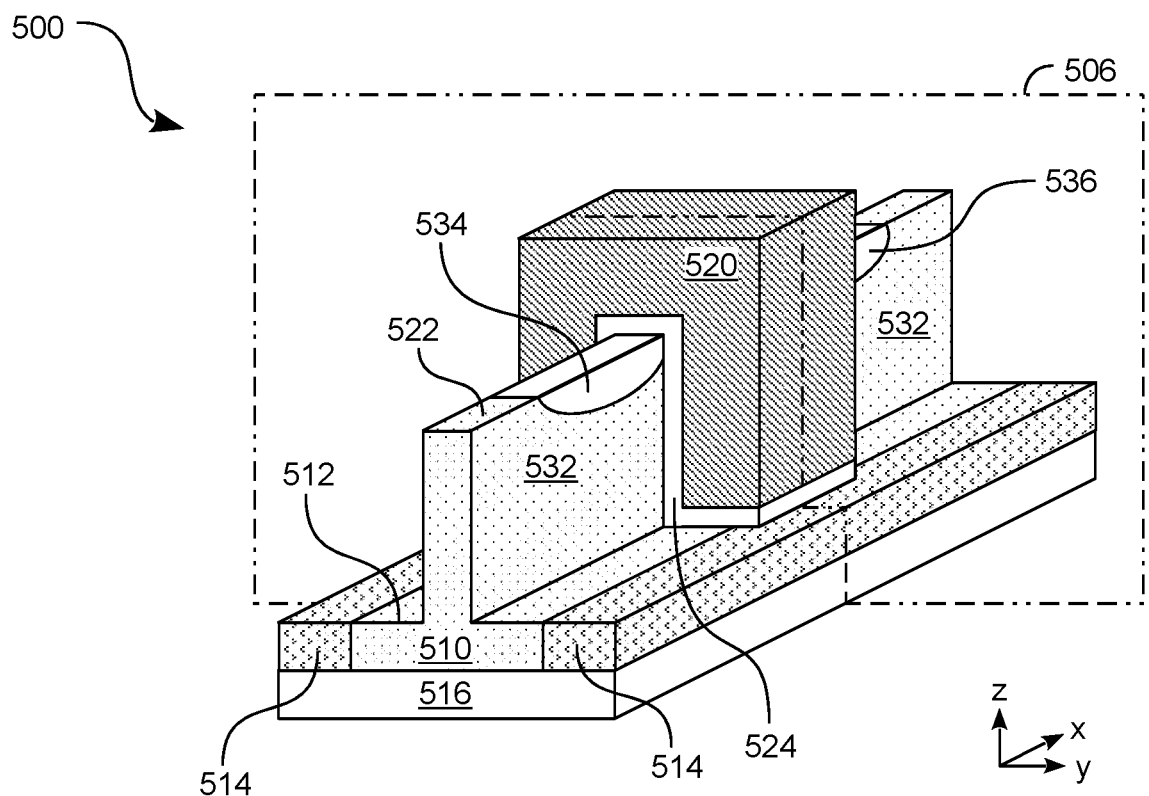
FIG. 5 shows a perspective view and a cross-sectional end view each of a transistor device according to an embodiment.
Figure 5:
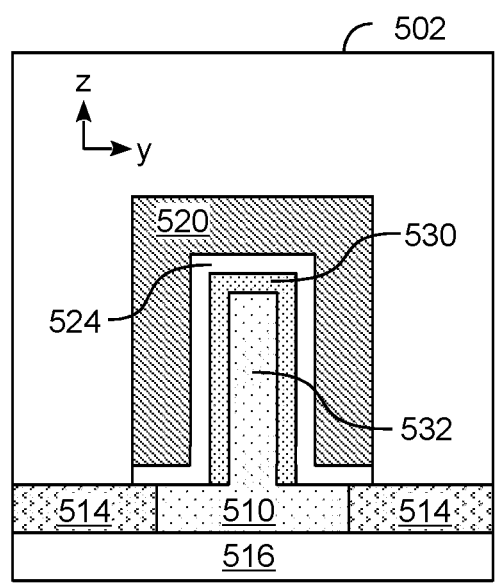

The transistor of IC device 400 may be a planar transistor (e.g., wherein the transistor is a TFT), or alternatively, any of a variety of non-planar transistor such as a tri-gate transistor, a finFET transistor, or the like. For example, FIG. 5 shows, in a perspective view, features of an integrated circuit (IC) device 500 including a high mobility semiconductor body and an adjoining wide bandwidth semiconductor body according to an embodiment. FIG. 5 also shows a cross-sectional view 502 of IC device 500 in the y-z plane 506 of the xyz coordinate system shown.

In the example embodiment shown, IC device 500 includes a buffer layer 510 having a side 512. Buffer layer 510 may comprise one or more epitaxial single crystalline semiconductor layers (e.g., silicon, germanium, silicon germanium, gallium arsenide, indium phosphide, indium gallium arsenide, aluminum gallium arsenide, etc.) which—for example—may be grown atop a different bulk semiconductor substrate (such as the illustrative silicon substrate 516 shown).

IC device 500 may further include on buffer layer 510 a first semiconductor body which forms a fin structure (such as the illustrative fin structure 532 shown). For example, the first semiconductor body may be formed in part from an epitaxially grown single crystalline semiconductor such as, but not limited to Si, Ge, GeSn, SiGe, GaAs, InSb, GaP, GaSb, InAlAs, InGaAs, GaSbP, GaAsSb, GaN, GaP, and InP. Fin structure 532 may extend to side 512, in some embodiments. In other embodiments, the first semiconductor body may further comprise an underlying sublayer portion from which fin structure 532 extends (e.g., where the underlying sublayer portion is disposed between, and adjoins each of, side 512 and fin structure 532). At least partial electrical isolation of some or all of fin structure 532 may be provided with a dielectric 514 (such as a dielectric 112, for example).

A source and a drain of a transistor may each include a different respective one of doped regions 534, 536 of fin structure 532. The transistor may be configured to selectively provide a conductive channel between doped regions 534, 536, wherein the channel is to be controlled using a gate structure 520 which extends over a portion of fin structure 532. For example, a gate dielectric 524 may extend at least in part along, and adjoin, one or more sides of fin structure 532. In the example embodiment shown, gate dielectric 524 comprises a layer of dielectric material which extends over a top side 522 of fin structure 532. Such a layer of dielectric material may further extend along either or both of two opposing vertical sidewalls of fin structure 532—e.g., wherein gate dielectric 524 extends to side 512.

To mitigate current leakage and/or otherwise improve transistor performance, a layer 530 of a high mobility semiconductor may be disposed between gate dielectric 524 and a portion of fin structure 532 which is under gate dielectric 524. In such an embodiment, some or all of the portion of fin structure 532 includes a body of a wide bandgap semiconductor material (the body adjoining layer 530). In one such embodiment, another cross-section of IC device 500—the cross-section in a x-z plane that extends along a midline of fin structure 532—corresponds to the cross-sectional side view of IC device 400 in FIG. 4.

Figure 6:
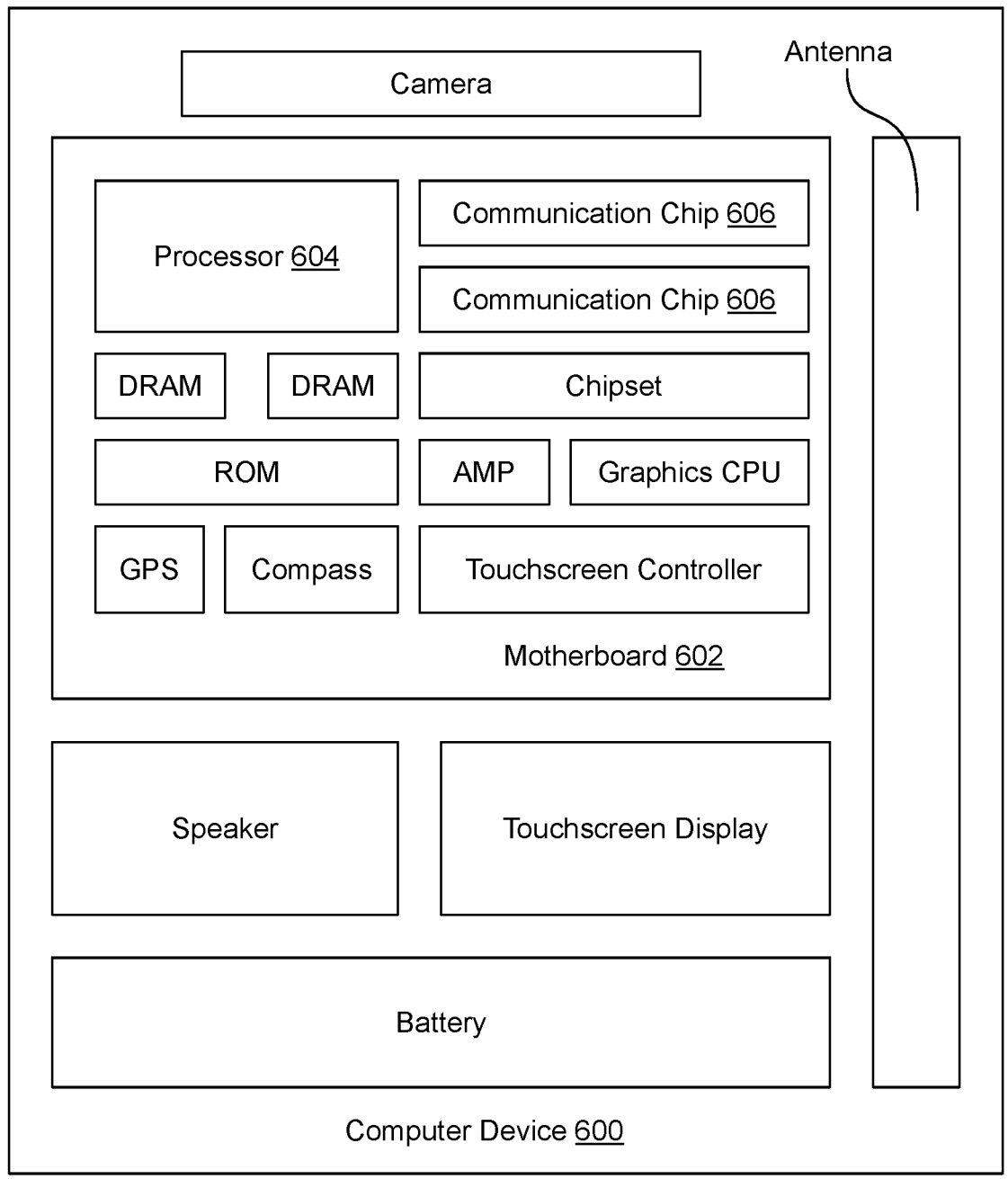
FIG. 6 illustrates a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
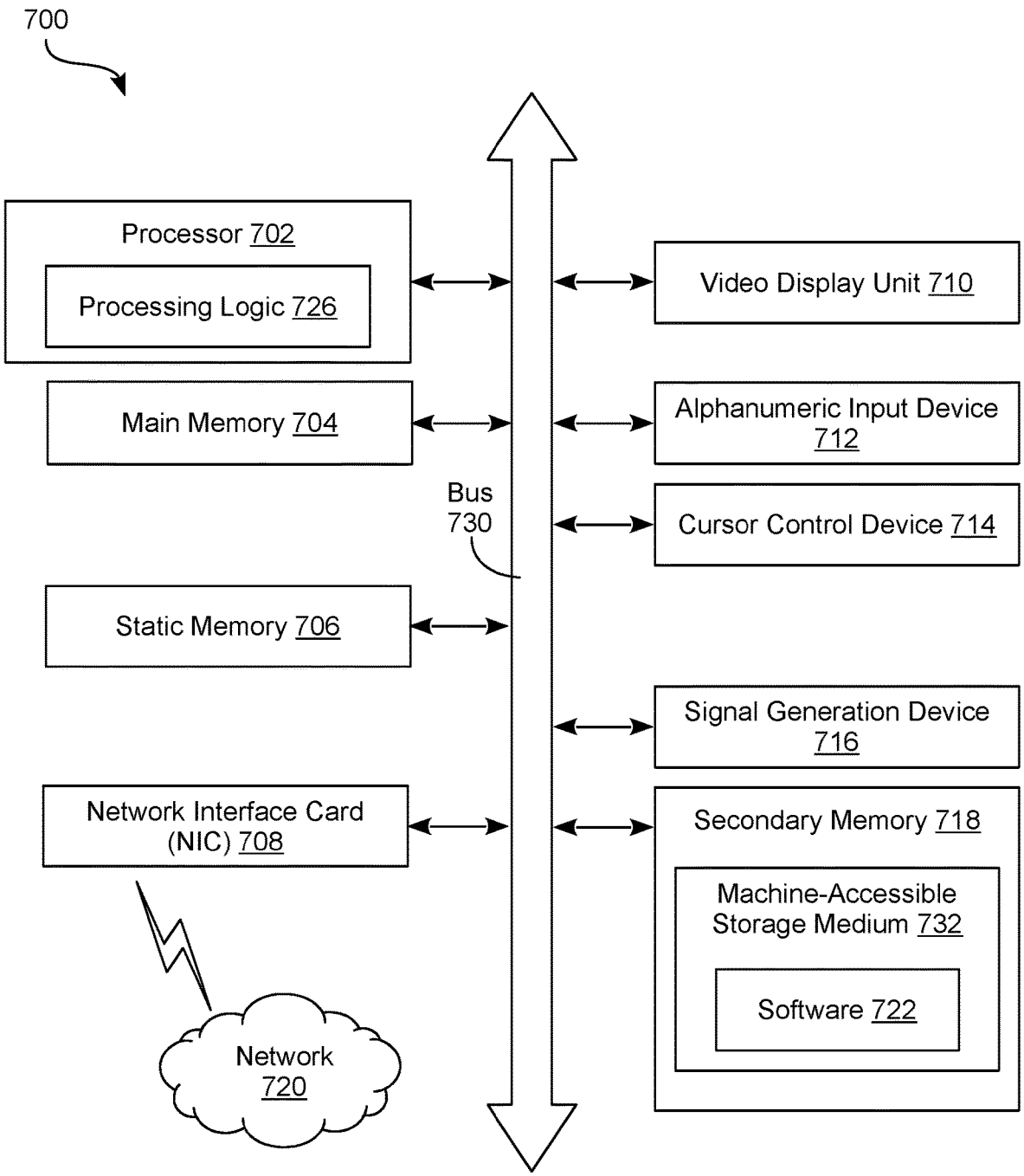
FIG. 7 illustrates a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for providing structures of a transistor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) comprising:
    a gate comprising a metal;
    a layer adjacent to the gate, the layer comprising a dielectric material;
    a source;
    a drain;
    a first body of a first semiconductor, the first body adjacent to the layer, wherein a mobility of the first semiconductor is equal to or greater than 100 $cm^2/V \cdot s$; and
    a second body of a second semiconductor other than the first semiconductor, wherein a bandgap of the second semiconductor is equal to or greater than 2.0 eV, wherein portions of the second body each adjoin a different respective one of the source or the drain, and wherein the first body is between the second body and the layer.

2. The IC of claim 1, wherein a first portion of the second body is disposed between the first body and one of the source or the drain.

3. The IC of claim 2, wherein a second portion of the second body is disposed between the first body and another of the source or the drain.

4. The IC of claim 1, wherein the first semiconductor comprises one of gallium, nitrogen, silicon, indium, phosphorous, or arsenic.

5. The IC of claim 4, wherein the first semiconductor comprises gallium and one of nitrogen, or arsenic.

6. The IC of claim 1, wherein the second semiconductor comprises one of titanium, indium, gallium, zinc, arsenic, tin, silicon, or germanium.

7. The IC of claim 6, wherein the second semiconductor comprises oxygen and one of titanium, indium, gallium, zinc, arsenic, or tin.

8. The IC of claim 1, wherein the second body is between the gate and a substrate, and wherein a thickness of the second body is in a range of 0.2 nanometers (nm) to 5.0 nm.

9. The IC of claim 1, wherein the gate is between the second body and a substrate, and wherein a thickness of the second body is more than 5.0 nanometers.

10. The IC of claim 9, wherein the thickness of the second body is in a range of 6 nanometers (nm) to 20 nm.

11. A method comprising:
forming a gate comprising a metal;
forming a layer adjacent to the gate, the layer comprising a dielectric material;
forming a first body of a first semiconductor adjacent to the layer, wherein a mobility of the first semiconductor is equal to or greater than 100 cm2/V·s;
forming a second body of a second semiconductor other than the first semiconductor, wherein a bandgap of the second semiconductor is equal to or greater than 2.0 eV; and
forming a source and a drain, wherein portions of the second body each adjoin a different respective one of the source or the drain, wherein the first body is between the second body and the layer.

12. The method of claim 11, wherein a first portion of the second body is disposed between the first body and one of the source or the drain.

13. The method of claim 12, wherein a second portion of the second body is disposed between the first body and another of the source or the drain.

14. The method of claim 11, wherein the first semiconductor comprises one of gallium, nitrogen, silicon, indium, phosphorous, or arsenic.

15. The method of claim 14, wherein the first semiconductor comprises gallium and one of nitrogen, or arsenic.

16. The method of claim 11, wherein the second semiconductor comprises one of titanium, indium, gallium, zinc, arsenic, tin, silicon, or germanium.

17. The method of claim 16, wherein the second semiconductor comprises oxygen and one of titanium, indium, gallium, zinc, arsenic, or tin.

18. The method of claim 11, wherein the second body is between the gate and a substrate, and wherein a thickness of the second body is in a range of 0.2 nanometers (nm) to 5.0 nm.

19. The method of claim 11, wherein the gate is between the second body and a substrate, and wherein a thickness of the second body is more than 5.0 nanometers.

20. The method of claim 19, wherein the thickness of the second body is in a range of 6 nanometers (nm) to 20 nm.

21. A system comprising:
an integrated circuit (IC) comprising:
a gate comprising a metal;
a layer adjacent to the gate, the layer comprising a dielectric material;
a source;
a drain;
a first body of a first semiconductor, the first body adjacent to the layer, wherein a mobility of the first semiconductor is equal to or greater than 100 cm$^2$/V·s; and
a second body of a second semiconductor other than the first semiconductor, wherein a bandgap of the second semiconductor is equal to or greater than 2.0 eV,
wherein portions of the second body each adjoin a different respective one of the source or the drain, and wherein the first body is between the second body and the layer; and
a display device coupled to the IC, the display device configured to display an image based on a signal communicated with the IC.

22. The system of claim 21, wherein a first portion of the second body is disposed between the first body and one of the source or the drain.

23. The system of claim 22, wherein a second portion of the second body is disposed between the first body and another of the source or the drain.

24. The system of claim 21, wherein the first semiconductor comprises one of gallium, nitrogen, silicon, indium, phosphorous, or arsenic.

25. The system of claim 24, wherein the first semiconductor comprises gallium and one of nitrogen, or arsenic.

* * * * *